(12) United States Patent
Kahen

(10) Patent No.: US 7,375,011 B1
(45) Date of Patent: May 20, 2008

(54) EX-SITU DOPED SEMICONDUCTOR TRANSPORT LAYER

(75) Inventor: Keith B. Kahen, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 11/677,794

(22) Filed: Feb. 22, 2007

(51) Int. Cl.
*H01L 21/20* (2006.01)

(52) U.S. Cl. ............... 438/502; 438/499; 438/492; 977/892; 117/56; 257/E21.114; 257/E21.12; 257/E21.133

(58) Field of Classification Search ............... 438/499, 438/492, 502; 977/892; 117/56; 257/E21.114, 257/E21.12, E21.132, E21.133
See application file for complete search history.

(56) References Cited

U.S. PATENT DOCUMENTS 5,262,357 A * 11/1993 Alivisatos et al. .......... 438/488
7,087,832 B2    8/2006 Scher et al.

OTHER PUBLICATIONS

O. Masala et al, Synthesis Routes for Large Volumes of Nanoparticles, Annu. Rev. Mater. Res. 34, (2004) pp. 41-81.
Pradham et al, Collodial CdSe Quantum Wires by Oriented Attachment, Nano Letters, V01. 6, No. 4, pp. 720-724, 2006.
R. J. Jouet et al, Surface Passivation of Bare Aluminum Nanoparticles Using Perfluoroalkyl Carboxylic Acids, Chem. Mater. 17, pp. 2987-2996 (2005).
Murray et al, Synthesis and Characterization of Nearly Monodisperse CdE (E=S, Se, Te) Semiconductor Nanocrystallites, J. Am Chem, 1993, 115 pp. 8706-8715.
Liu et al, Employing End-Functional Polythiophene to Control the Morphology of Nanocrystal-Polymer Composites in Hybrid Solar Cells, J. Am. Chem. Soc. 2004, 126, pp. 6550-6551.
Huang et al, Low voltage organic electroluminescent devices using pin structures, App. Phys. Lett. V.80, No. 1, Jan. 2002, pp. 139-141.
Gur et al, Air Stable All Inorganic Nanocrystal Solar Cells Processed From Solution, Science, Vo. 310, Oct. 2005, 462-465.
Erwin et al, Doping semiconductor nanocrystals, Nature Letters, V43617, Jul. 2005, pp. 91-94.
Dhere et al, Thin-film photovoltaics, J. Vac. Sci. Tech. A23(4) Jul./Aug. 2005, pp. 1208-1214.

(Continued)

*Primary Examiner*—Matthew S. Smith
*Assistant Examiner*—Julio J Maldonado
(74) *Attorney, Agent, or Firm*—Raymond L. Owens

(57) ABSTRACT

A method of making an ex-situ doped semiconductor transport layer for use in an electronic device includes: growing a first set of semiconductor nanoparticles having surface organic ligands in a colloidal solution; growing a second set of dopant material nanoparticles having surface organic ligands in a colloidal solution; depositing a mixture of the first set of semiconductor nanoparticles and the second set of dopant material nanoparticles on a surface, wherein there are more semiconductor nanoparticles than dopant material nanoparticles; performing a first anneal of the deposited mixture of nanoparticles so that the organic ligands boil off the surfaces of the first and second set of nanoparticles; performing a second anneal of the deposited mixture so that the semiconductor nanoparticles fuse to form a continuous semiconductor layer and the dopant material atoms diffuse out from the dopant material nanoparticles and into the continuous semiconductor layer.

17 Claims, 5 Drawing Sheets

OTHER PUBLICATIONS

M. A. Hines et al, Bright UV-Blue Luminescent Colloidal ZnSe Nanocrystals, J. Phys. Chem. B102 pp. 3655-3657 (1998).

JV Singh et al, Synthesis and Characterization of Some Alkoxide Derivatives of Copper (II), Z. anorg.allg.Chem, 477 pp. 235-240 (1981).

Yu et al n-Type Conducting CdSe Nanocrystal Solids, Science, vol. 300, Mayh 2003, pp. 1277-1280.

Hambrock et al, A non-aqueous organometallic route to highly monodispersed copper nanoparticles using [Cu(OCHChMe)CH$_2$NMe$_2$)$_2$], Chem. Commun. pp. 68-69 (2002).

C. B. Murray et al., Synthesis and Characterization of Monodisperse Nanocrystals and Close-Packed Nanocrystal Assemblies, Annu. Rev. Mater. Sci. 30, 545-593 (2000).

A. N. Goldstein et al., Melting in Semiconductor Nanocrystals, Science 256, 1425-1426 (1992).

K. B. Kahen, Rigorous optical modeling of multilayer organic light-emitting diode devices, Appl. Phys. Lett. 78, 1649-1651 (2001).

P. J. George et al., Doping of chemically deposited intrinsic CdS thin films to n type by thermal diffusion of indium, Appl. Phys. Lett. 66, 3624-3626 [1995].

Rossetti et al, Size effects in the excited electronic states of small colloidal CdsS crystallites, J. Chem Phys, Vo. 80, No. 9, May 1, 1984, pp. 4464-4469.

\* cited by examiner

EX-SITU DOPED SEMICONDUCTOR TRANSPORT LAYER

This invention was made with Government support under Cooperative Agreement #DE-FC26-06NT42864 awarded by DOE. The Government has certain rights in this invention.

CROSS REFERENCE TO RELATED APPLICATION

Reference is made to commonly assigned U.S. patent application Ser. No. 11/668,041 filed Jan. 29, 2007, entitled "Doped Nanoparticle Semiconductor Charge Transport Layer" by Keith B. Kahen, the disclosure of which is incorporated herein.

FIELD OF THE INVENTION

The present invention relates to inorganic semiconductor devices that include charge transport layers composed of inorganic nanoparticles.

BACKGROUND OF THE INVENTION

Charge transport layers containing n-type or p-type semiconductors can be used in making a variety of devices such as field effect transistors, bipolar transistors, p-n diodes, light emitting diodes (LEDs), lasers, sensors, solar cells and others. Most semiconductor devices in use today, both inorganic and organic, are in part or completely formed using expensive vacuum deposition processes. There are ongoing efforts to find a low cost manufacturing process, but to date, device performance has been inadequate for market needs. Therefore, there is a need for a low cost technique of forming high quality inorganic charge transport layers for use in semiconductor devices.

In general, both n-type and p-type materials can be referred to as charge transport materials, and the layers of a device containing such materials can be referred to as charge transport layers. An n-type material typically has an excess of conduction band electrons, and as such is also referred to as an electron transport material. Furthermore, an n-type semiconductor is a semiconductor in which electrical conduction is due chiefly to the movement of electrons. A p-type material typically has an excess of "holes", and as such is also referred to as a hole transport material. Furthermore, a p-type semiconductor is a semiconductor in which electrical conduction is due chiefly to the movement of positive holes. The doping levels of the charge transport layers are typically set so that they are highest when the layers are in contact with metals (in order to assist in forming ohmic contacts). For the case of the layers being in contact with the anode or cathode, the charge transport layers are also typically called contact layers.

Semiconductor diode devices have been in use since the late 1800s. Most modern diode technologies are based on semiconductor p-n junctions, or contact between p-type and n-type semiconductors. However, many types of electronics would benefit from lower cost charge transport layers. Therefore, multiple types of junctions may be formed using the charge transport layers of this invention. For example, in addition to the p/n junction, the junction could be a p/p junction, an n/n junction, a p/i junction (where i refers to an intrinsic semiconductor), an n/i junction, or the like. A junction may also be a semiconductor/semiconductor junction, a semiconductor/metal junction (a Schottky junction), or a semiconductor/insulator junction. The junction may also be a junction of two different semiconductor materials (a heterojunction), a doped semiconductor to a doped or an undoped semiconductor, or a junction between regions having different dopant concentrations. The junction may also be a defected region to a perfect single crystal, an amorphous region to a crystal, a crystal to another crystal, an amorphous region to another amorphous region, a defected region to another defected region, an amorphous region to a defected region, or the like.

In the field of photovoltaic devices, current devices employ thin layers of semiconductor material, e.g., crystalline silicon, gallium arsenide, or the like, incorporating a p-n junction to convert solar energy to direct current. While these devices are useful in certain applications, their efficiency has been somewhat limited, yielding conversion efficiencies, e.g., solar power to electrical power, of typically marginally better than 10-20%. Although efficiencies of these devices have been improving through costly improvements to device structure, the relative inefficiency of these devices, combined with their relatively high cost, have combined to inhibit the widespread adoption of solar electricity in the consumer markets. Instead, such systems have been primarily used where conventionally generated electricity is unavailable, or where costs associated with bringing conventionally generated electricity, to a location where it is needed, more closely match the costs of photovoltaic systems.

Despite the issues with current photovoltaic technology, there is still a desire and a need to expand usage of solar electricity. In particular, there is generally a need for an improved photovoltaic cell that has one or more of: increased energy conversion efficiency, decreased manufacturing costs, greater flexibility and/or reasonable durability and/or longevity. In fact, as disclosed in U.S. Pat. No. 7,087,832 Scher et al. disclose the use of coatable nanoparticles in a polymer binder for use in photovoltaic devices. However, the performance of these devices were not reported, and the conductivity of such a mixed photoactive layer is expected to be low due to the high resistivity of the polymeric binder. An example of the performance of devices with these hybrid absorber layers is an efficiency of ~1.5% under AM 1.5 excitation (J. Liu et al., JACS 126, 6550 (2004)). Recently, an all inorganic solution processed solar cell was formed from CdSe and CdTe quantum rod nanoparticles, but again the efficiency was very low at 3% even after sintering the films at 400° C. for 15 minutes (I. Gur et., Science 310, 462 (2005)). A large part of the low efficiency was undoubtedly due to the films being insulators (even after sintering) due to the lack of doping. For both CdTe and $CuIn_{1-x}Ga_xSe_{2-y}S$ (CIGSS) solar cells, the window layer is typically n-CdS (N. G. Dhere et al., J. Vac. Sci. Technol. A23, 1208 (2005)). Both doped and undoped forms of CdS have been used in the devices and a preferred deposition technique has been chemical bath deposition (CBD). Even though a solution processed technique, CBD involves dunking the entire wafer into a bath, which can be acidic or basic, for periods up to hours. In addition, the process is inefficient with respect to usage of its starting materials.

FIG. 1 shows a schematic of a typical prior art LED device 105 that incorporates charge transport layers. All of the device layers are deposited on a substrate 100. Above the substrate 100 are a p-contact layer 110, a p-transport layer 120, an intrinsic emitter layer 130, a n-transport layer 140, and a n-contact layer 150. An anode 160 makes ohmic contact with the p-contact layer 110, while a cathode 170 makes ohmic contact with the n-contact layer 150. As is well-known in the art, LED structures typically contain doped n- and p-type transport layers, and more heavily doped n- and p-type contact layers. They serve a few different purposes. Forming ohmic contacts to semiconductors is simpler if the semiconductors are doped. Since the emitter layer is typically intrinsic or lightly doped, it is much simpler to make ohmic contacts to the doped transport layers. As a result of surface plasmon effects (K. B. Kahen, Appl. Phys. Lett. 78, 1649 (2001)), having metal layers adjacent to emitter layers results in a loss emitter efficiency. Consequently, it is advantageous to space the emitter layers from the metal contacts by sufficiently thick (at least 150 nm) transport layers. Next it is advantageous to employ transport layers that not only can easily inject charge into the emitter layer, but also prevent the carriers from leaking back out of the emitter layer. As a consequence, the transport layers will have the largest bandgaps of the device layers. As is well known in the art, highly doping wide bandgap semiconductors is difficult as a result of self-compensation effects. Consequently, forming ohmic contacts to these layers can prove to be difficult. As a result, it is adventitious to add contact layers to the device whose bandgap is smaller than that of the transport layers. Beyond these advantages, doping the transport layers also reduces ohmic heating effects (which can be highly important for laser devices) and leads to larger separations of the n- and p-Fermi levels (which also aids laser, pin diode, and photovoltaic devices). The above discussion illustrates that having the ability to create doped transport layers results in numerous advantages for many semiconductor electronic devices.

LED devices have been made since the early 1960's and currently are manufactured for usage in a wide range of consumer and commercial applications. The layers comprising the LEDs are conventionally based on crystalline semiconductor materials that require ultra-high vacuum techniques for their growth, such as, metallo-organic chemical vapor deposition (MOCVD). In addition, the layers typically need to be grown on nearly lattice-matched substrates in order to form defect-free layers. These crystalline-based inorganic LEDs have the advantages of high brightness (due to layers with high conductivities), long lifetimes, good environmental stability, and good external quantum efficiencies. The high conductivities of the transport layers result from high mobilities (due to the crystalline nature of the films) and the ability to readily dope crystalline layers with donors and acceptors. The usage of crystalline semiconductor layers that results in all of these advantages, also leads to a number of disadvantages. The dominant ones are high manufacturing costs, difficulty in combining multi-color output from the same chip, and the need for high cost and rigid substrates.

A way for forming low cost LEDs began in the 1980's with the introduction of organic light emitting diodes (OLED) (Tang et al, Appl. Phys. Lett. 51, 913 (1987)). The transport layers for these devices are highly resistive ($10^8$ ohm-cm) in comparison with those used in crystalline LEDs. Recent attempts at doping these layers (J. Huang et al., Appl. Phys. Lett. 80, 139 (2002)) have resulted in layer resistivities in the $10^4$-$10^6$ ohm-cm range. However, many of these dopants are unstable and the resistivities are many orders of magnitude higher than crystalline LED values of ~0.1 ohm-cm. The result of employing resistive layers is that one suffers from ohmic heating effects; it is difficult to make ohmic contacts; and since the drive current of the device is limited, so is the overall brightness of the device.

The above examples illustrate that higher performance semiconductor devices can be created from crystalline semiconductor materials; but with the drawback of high manufacturing costs. Attempts to reduce the manufacturing costs by employing organic materials result in lower performance devices whose specs sometimes fall significantly short of market requirements (e.g., organic-based photovoltaics). Two approaches to lower the cost of crystalline semiconductor materials are to employ either amorphous or polycrystalline inorganic semiconductor materials; however, both of these approaches have well-known drawbacks. Taking the case of devices formed from amorphous Si, both thin-film transistor and photovoltaic (PV) devices have significantly reduced performance due to low mobilities (and the Staebler-Wronski effect for PVs). The performance of polycrystalline-based devices is improved with devices being formed from processes, such as, sputtering and CBD. However, sputtering is a higher cost, vacuum-based deposition process and CBD, though chemically based, has long deposition times and is inefficient in its usage of starting materials, as stated previously.

The newest way for creating low cost semiconductor devices is to form the layers from inorganic semiconductor nanoparticles. To obtain the full advantage of these crystalline particles for usage in semiconductor transport layers, the nanoparticles should both be doped (to increase their intrinsic carrier concentration) and devoid of organic ligands on their surface (which impede charge transport). In spite of a plethora of reports about doping nanoparticles to modify their emission and magnetic characteristics (S. C. Erwin et al., Nature 436, 91 (2005)), there has been very limited research devoted to modifying the nanoparticle's carrier concentration (D. Yu et al., Science 300, 1277 (2003)). In the work of Yu et al. (D. Yu et al., Science 300, 1277 (2003)), even though they doped nanoparticle films, it was done by adding potassium through a high vacuum, post deposition, vacuum evaporation process. In general, even if nanoparticles are stripped of their insulating organic ligands by an annealing process, without added impurities atoms to modify the donor or acceptor concentrations, the resulting nanoparticles have limited conductivities (I. Gur et., Science 310, 462 (2005)).

SUMMARY OF THE INVENTION

It is an object of this invention to provide an inorganic semiconductor device whose doped charge transport layer is formed from semiconductor and dopant material nanoparticles. The dopant material nanoparticles can either be metallic or semiconductor nanoparticles.

This object is achieved by the method of making an ex-situ doped semiconductor transport layer for use in an electronic device comprising:

(a) growing a first set of semiconductor nanoparticles having surface organic ligands in a colloidal solution;

(b) growing a second set of dopant material nanoparticles having surface organic ligands in a colloidal solution;

(c) depositing a mixture of the first set of semiconductor nanoparticles and the second set of dopant material nanoparticles on a surface, wherein there are more semiconductor nanoparticles than dopant material nanoparticles;

(d) performing a first anneal of the deposited mixture of nanoparticles so that the organic ligands boil off the surfaces of the first and second set of nanoparticles; and (e) performing a second anneal of the deposited mixture so that the semiconductor nanoparticles fuse to form a continuous semiconductor layer and the dopant material atoms diffuse out from the dopant material nanoparticles and into the continuous semiconductor layer to provide an ex-situ doped semiconductor transport layer.

It is an advantage of the present invention to enable a simple method of forming doped semiconductor charge transport layers. The charge transport layer is doped ex-situ by coating on a surface a mixture of semiconductor and dopant material nanoparticles, wherein an anneal is performed to fuse the semiconductor nanoparticles and to enable dopant material atoms to diffuse out from the dopant material nanoparticles and into the fused semiconductor nanoparticle network. Inorganic device layers composed of inorganic nanoparticles are typically highly resistive, which limits the usefulness of these devices despite their low cost. By implementing ex-situ doping of the annealed inorganic nanoparticles in the transport layers of devices, these devices can be produced at low cost while still maintaining good device performance. Doped transport layers help device performance by increasing the separation of the n- and p-Fermi levels, reduce ohmic heating, and aide in forming ohmic contacts. By forming the transport layers from ex-situ doped inorganic nanoparticles, the device layers can be deposited by low cost processes, such as, drop casting, spin coating, and inkjetting. The resulting nanoparticle-based devices can also be formed on a range of substrates.

DETAILED DESCRIPTION OF THE INVENTION

Figure 1:
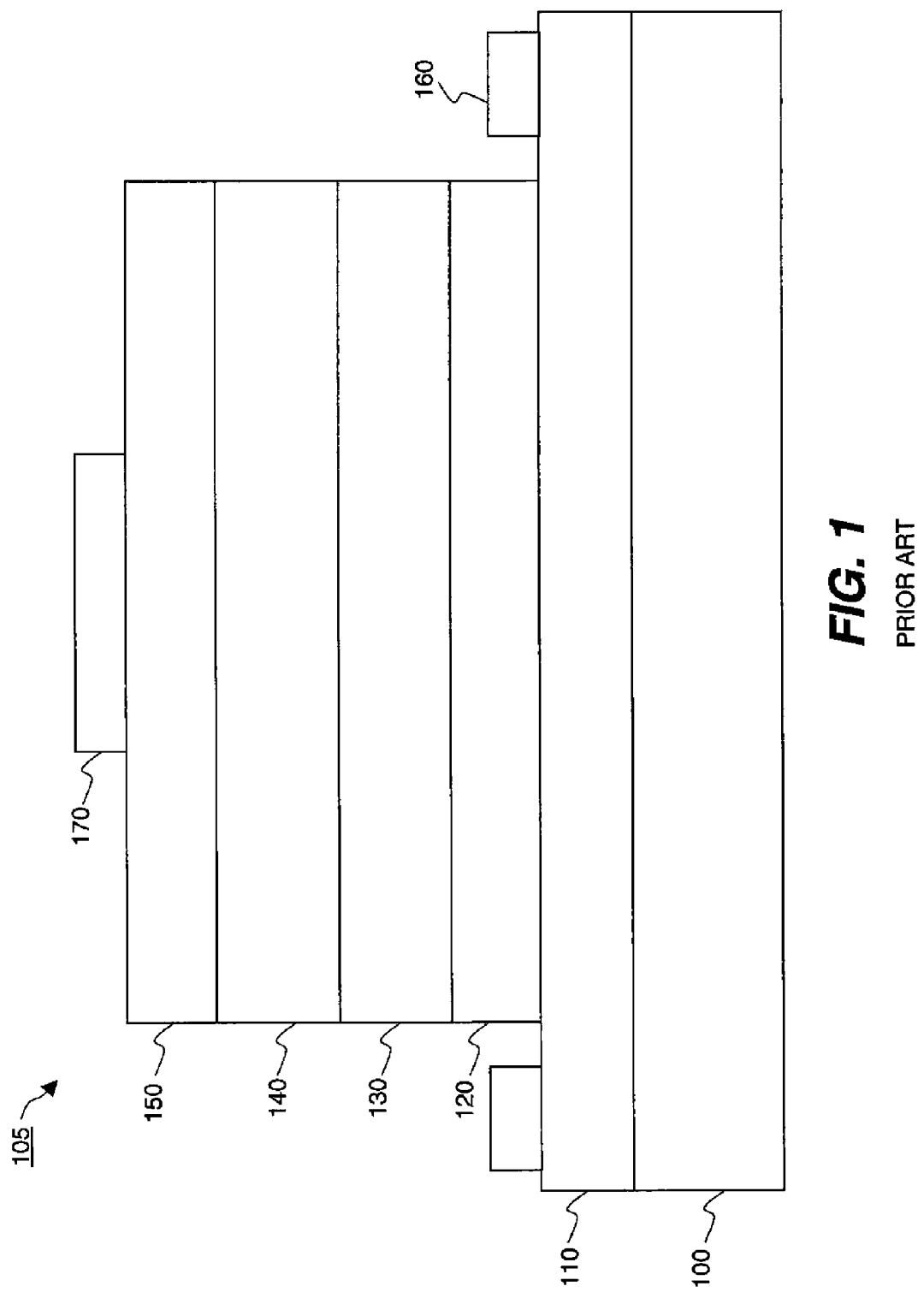
FIG. 1 shows a side-view schematic of a prior art inorganic light emitting diode device.
Figure 2:
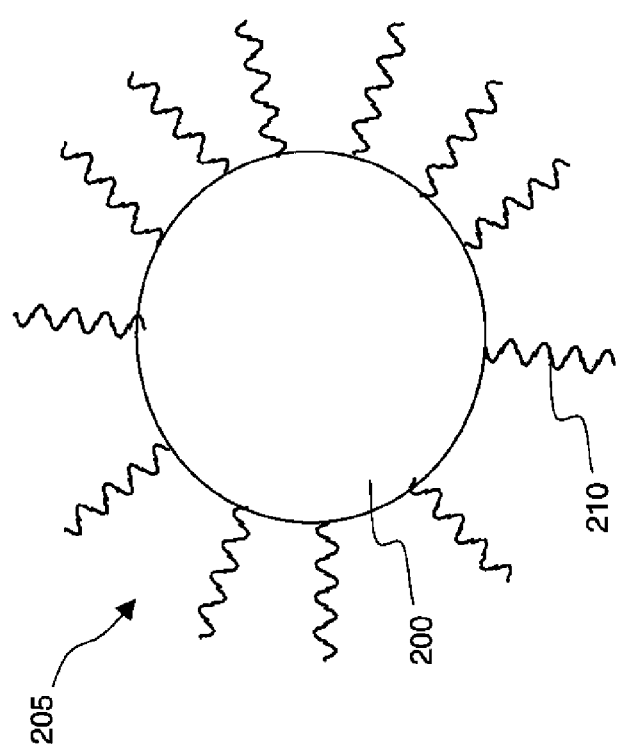
FIG. 2 shows a schematic of a colloidal inorganic nanoparticle.

It is desirable to form devices that not only have good performance, but also are low cost and can be deposited on arbitrary substrates. Using colloidal-based nanoparticles as the building blocks for semiconductor electronic devices would result in devices that confer these advantages as long as the layers can be properly doped. A typical colloidal inorganic nanoparticle 205 is shown in FIG. 2. In the figure the inorganic nanoparticle 205 is composed of a semiconductor core 200, on whose surface is bonded organic ligands 210. The organic ligands 210 give stability to the resulting colloidal dispersion (the inorganic nanoparticle 205 and an appropriate solvent). Even though the inorganic nanoparticle 205 shown in FIG. 2 is spherical in shape, nanoparticles can be synthesized to be shapes ranging from quantum rods and wires, to tetrapods and other multiply connected nanoparticles that show quantum confinement effects.

Semiconductor films can be doped by a number of ways. Some of these are extrinsic processes, namely, the doping occurs after the materials comprising the layer have been grown or synthesized. For example, extrinsic donors and acceptors can be introduced into a layer by ion implantation and by diffusion processes (P. J. George et al., Appl. Phys. Lett. 66, 3624 (1995)). For the diffusion processes, the source for the dopant materials can be a solid source (metal film on the layer surface), a liquid source (containing appropriate metal ions), and a vapor source (e.g., closed tube diffusions containing a subliming metallic source). Even though the semiconductor industry has a long history of implementing these extrinsic doping procedures, they involve extra processing steps, such as, removing the solid diffusion source once the diffusion process is complete. Another way for generating donors and acceptors is by creation of native defects. In compound semiconductors they can be generated by annealing the layers under appropriate overpressure conditions. In general this method is not preferred. The preferred doping approach is called in-situ doping that occurs when donors or acceptors are introduced into the semiconductor materials during their synthesis. For crystalline semiconductors, in-situ doping has been highly successful, especially using the ultra high vacuum processes such as MOCVD and molecular beam epitaxy (MBE).

Adapting in-situ doping to inorganic nanoparticles 205 has a number of challenging issues associated with it. Foremost is the problem that doping levels are typically in the 1 part in $10^4$-$10^5$ range, while a 4 nm spherical nanoparticle only contains on the order of 1000 atoms (C. B. Murray et al., JACS 115, 8706 (1993)). As a result, many of the nanoparticles would not contain a dopant atom. This situation causes problems since if a large fraction of the nanoparticles are undoped, then these nanoparticles would be highly resistive which would result in the device layer being highly resistive. The only way to resolve this problem is to sinter the nanoparticles together to such a degree that the individuality of the separate nanoparticles is removed. Another issue is that incorporating impurity atoms in nanoparticles was shown to be difficult for certain crystal structures (S. C. Erwin et al., Nature 436, 91 (2005)), such as, zinc blend.

Figure 3:
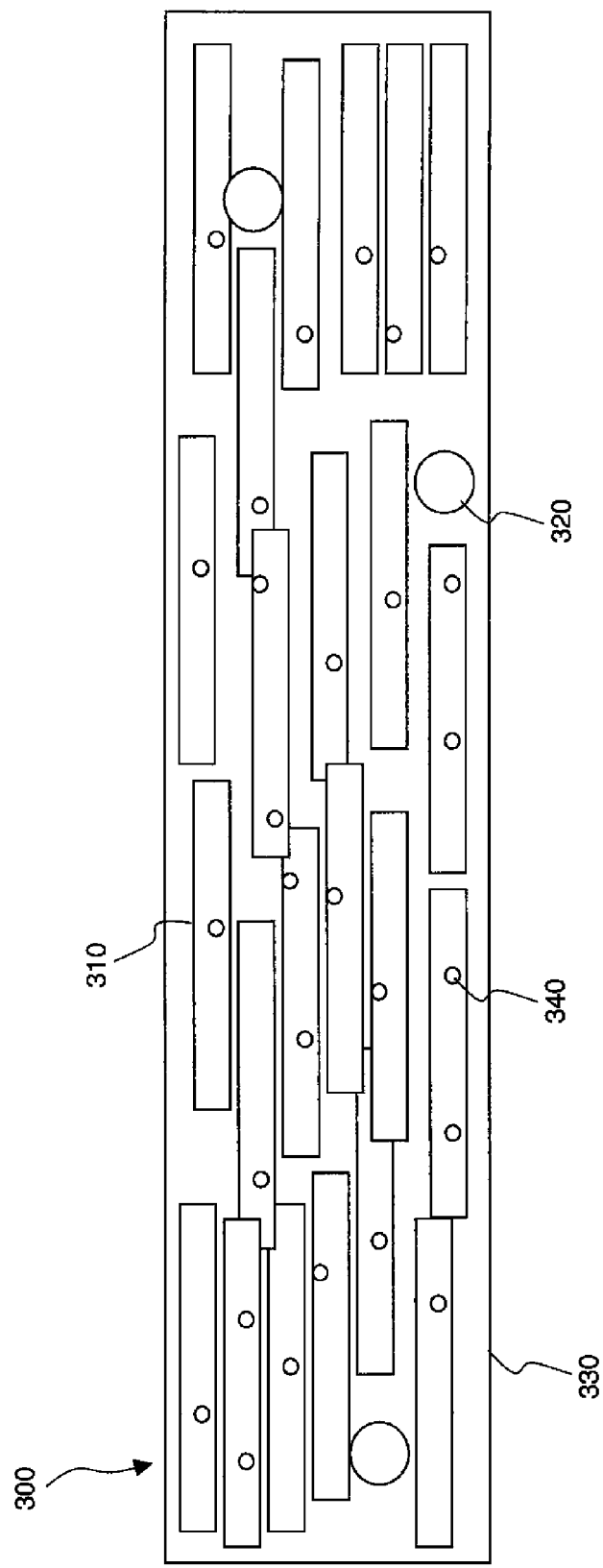
FIG. 3 shows a schematic of an ex-situ doped semiconductor charge transport layer containing semiconductor and dopant material nanoparticles.

Our strategy for dealing with these issues is to develop a low cost version of the ex-situ dopant diffusion process (refer to FIG. 3). Instead of diffusing the dopant material atoms from sources external to a semiconductor transport layer 330, dopant material nanoparticles 320 are formed and co-dispersed with semiconductor nanoparticles 310 such that the diffusion source for dopant material atoms 340 is internal to the semiconductor transport layer 330. In this fashion, each dopant material nanoparticle 320 inside of the semiconductor transport layer 330 acts as an internal source of dopant material atoms 340. Two sets of anneals are performed on the semiconductor transport layer 330 containing semiconductor 310 and dopant material 320 nanoparticles. A lower temperature anneal (below 220° C.) is used to boil off the insulating organic ligands 210. A higher temperature anneal (between 250 and 500° C.) is used to fuse the semiconductor nanoparticles 310, resulting in a continuous semiconductor layer, and simultaneously causes the dopant material atoms 340 to diffuse out from the dopant material nanoparticles 320 and into the continuous semiconductor layer to provide appropriate doping so that an ex-situ doped semiconductor transport layer 300 is formed. Having an internal source for the dopant material atoms 340 has a few advantages over conventional methods: 1) A separate anneal step is not required in order diffuse the dopants, since it occurs during the fusing of the semiconductor nanoparticles; 2) Extra and costly processing steps are not required to deposit the diffusion source and remove it once the anneal has occurred; and 3) Diffusion occurs more rapidly and at lower temperatures since the diffusion sources are nanoparticles, the semiconductor matrix is initially porous (becomes less so during the fusing process), and the diffusion sources are distributed throughout the semiconductor matrix (less distance to travel). Even though FIG. 3 shows the shape of the semiconductor nanoparticles 310 to be a quantum wire, it could be any colloidal nanoparticle that shows quantum size effects, such as, quantum dots, quantum rods, branched quantum rods, tetrapods, and any other multiply connected nanoparticle that show quantum confinement effects. Analogously, FIG. 3 shows the dopant material nanoparticle 320 to be a quantum dot, whereas, it can also be any colloidal nanoparticle, either singly or multiply connected, that shows quantum size effects.

In general the semiconductor nanoparticles composing the ex-situ doped semiconductor transport layer 300 can be selected from type II-VI, III-V, IV-VI, or IV semiconductor materials. Specific type IV semiconductors are Si, Ge, and Sn. Specific type III-V semiconductors are AlN, AlP, AlAs, and AlSb; GaN, GaP, GaAs, and GaSb; and InN, InP, InAs, and InSb. Specific II-VI semiconductors are ZnS, ZnSe, and ZnTe; CdS, CdSe, and CdTe, HgS, HgSe, and HgTe. Specific IV-VI semiconductors are PbS, PbSe, and PbTe. These semiconductors can be doped with a well-known set of donor and acceptor atoms. For the invented low cost ex-situ doping process, dopant material atom 340 selection is limited by the requirement that one can synthesize a nanoparticle composed either solely of those atoms or shelled by these atoms. Accordingly, the common list of donors and acceptors gets slightly reduced to include only those elements whose state of matter at room temperature is either a metal or a semiconductor. Given this restriction, the type II-VI, III-V, IV-VI, and IV semiconductor materials can be doped by the invented ex-situ doping processes using the following list of dopant material atoms 340. For type IV semiconductors, the dopant material atoms 340 can be selected from group III or V materials. For type III-V semiconductors, the dopant material atoms 340 can be selected from group IIa, IIb, IV, or VI materials. For type II-VI semiconductors, the dopant material atoms 340 can be selected from group Ia, Ib, III, or V materials. For type IV-VI semiconductors, the dopant material atoms 340 can be selected from group III or V materials. As can be seen from this list, group VII dopants have been excluded since they are gases at room temperature.

Colloidal semiconductor nanoparticles 310 are made by chemical methods well known in the art. Typical synthetic routes are decomposition of molecular precursors at high temperatures in coordinating solvents (C. B. Murray et al., Annu. Rev. Mater. Sci. 30, 545 (2000)), solvothermal methods (O. Masala and R. Seshadri, Annu. Rev. Mater. Res. 34, 41 (2004)) and arrested precipitation (R. Rossetti et al., J. Chem. Phys. 80, 4464 (1984)). If, for example, the semiconductor nanoparticles 310 were CdSe quantum wires, then the following procedure yields both quantum wires and pre-wire aggregates (N. Pradhan et al., Nano Letters 6, 720 (2006)). Briefly, the cadmium precursor is cadmium acetate and the Se precursor is selenourea, where equal molar ($1.27 \times 10^{-4}$ moles) amounts are used in the synthesis. The coordinating solvent for the growth is octylamine (OA). After adding appropriate amounts of OA to the cadmium acetate and selenourea (done in a dry box), both dissolve after gentle heating under constant spinning. Use standard Schlenk line procedures, the cadmium acetate solution is added to a 3-neck flask and degassed on the Schlenk line. Next it is heated to 120° C. The selenourea solution is placed in a syringe and injected into the 3-neck flask at 120° C. The contents of the flask turn a deep red within seconds of the injection. Under slow stirring the growth of CdSe quantum wires is continued for 4-6 hours at 120° C., followed by a final 20 minute anneal at 140° C.

The colloidal dopant material nanoparticles 320 are also made by chemical methods well known in the art. As discussed above, the dopants can either be metal atoms (such as, Mg, Cu, Zn, or In) or semiconductor atoms (such as, Si, Ge, or Te). Colloidal synthesis of metallic nanoparticles of Au, Ag, and Cu and semiconductor nanoparticles of Si and Ge were reviewed by Masala et al. (O. Masala and R. Seshadri, Annu. Rev. Mater. Res. 34, 41 (2004)). Colloidal synthesis of Al nanoparticles was discussed by Jouet at al. (R. J. Jouet et al., Chem. Mater. 17, 2987 (2005)).

Having grown the semiconductor nanoparticles 310 and the dopant material nanoparticles 320, it is then necessary to form a mixed dispersion of them and deposit the dispersion on a surface to form the ex-situ doped semiconductor transport layer 300. Typical dopant concentrations in semiconductors are in the 1 part in $10^4$ to $10^6$ range. However, it has been found that incomplete dopant atom activation typically occurs. As a result, the ratio of dopant material atoms 340 to semiconductor atoms in the mixed dispersion is usually much greater than the 1 part in $10^4$ to $10^6$ range, with the range being as high as 1 part in $10^3$ to $10^2$ at times. In practice the proper ratio for achieving particular dopant (conductivity results for the transport layer) activation needs to be determined by experimentation.

As is well known in the art, three low cost techniques for forming nanoparticle films are depositing the colloidal mixed dispersion of semiconductor 310 and dopant material nanoparticles 320 by drop casting, spin coating and inkjetting. Common solvents for drop casting the mixed dispersion of semiconductor nanoparticles 310 and dopant material 320 nanoparticles are a 9:1 mixture of hexane:octane (C. B. Murray et al., Annu. Rev. Mater. Sci. 30, 545 (2000)). The organic ligands 210 that passivate the surfaces of the nanoparticles need to be chosen such that the semiconductor nanoparticles 310 and dopant material nanoparticles 320 are soluble in non-polar solvents. As such, organic ligands with hydrocarbon-based tails are good choices, such as, the alkylamines. Using well-known procedures in the art, the ligands coming from the growth procedure (trioctylphosphine oxide, for example) can be exchanged for the organic ligand 210 of choice (C. B. Murray et al., Annu. Rev. Mater. Sci. 30, 545 (2000)). When spin coating a colloidal mixed dispersion of semiconductor nanoparticles 310 and dopant material nanoparticles 320, the requirements of the solvents are that they easily spread on the deposition surface and the solvents evaporate at a moderate rate during the spinning process. It was found that alcohol-based polar solvents are a good choice; for example, combining a low boiling point alcohol, such as, ethanol, with higher boiling point alcohols, such as, a butanol-hexanol mixture or 1-propanol, results in good film formation. Correspondingly, ligand exchange can be used to attach an organic ligand 210 (to the semiconductor nanoparticles 310 and dopant material nanoparticles 320) whose tail is soluble in polar solvents; pyridine is an example of a suitable ligand.

Following the deposition of nanoparticles, the semiconductor transport layer 330 is subjected to two sets of anneals. The first anneal is performed in order to remove the insulating organic ligands 210 from the surfaces of the nanoparticles. The annealing can take place in either a tube furnace or a rapid thermal annealer, under either a vacuum or with an inert gas overpressure. As is well known in the art, other heating apparatus can also be used to boil off the organic ligands 210. Without the first annealing step, the resulting ex-situ doped semiconductor transport layers 300 would be highly resistive. By choosing the organic ligands 210 to have a low boiling point (less than 200° C.), they can be made to evaporate from the film during an annealing process (C. B. Murray et al., Annu. Rev. Mater. Sci. 30, 545 (2000)) where the anneal temperature is below 220° C. Consequently, for films formed by drop casting with non-polar solvents, shorter chained primary amines, such as, hexylamine are preferred; for films formed by spin coating with polar solvents, pyridine is a preferred ligand.

Following the anneal step to boil off the organic ligands 210, a second anneal step is performed to fuse the semiconductor nanoparticles and form a continuous semiconductor layer; while, simultaneously causing the dopant material atoms 340 to diffuse out from the dopant material nanoparticles 320 and into the continuous semiconductor layer to provide appropriate doping so that an ex-situ doped semiconductor transport layer 300 is formed. In the absence of the second anneal step, the ex-situ doped semiconductor transport layer 300 remains resistive since there is poor connectivity between the semiconductor nanoparticles 310 and electron and holes can get trapped by the semiconductor nanoparticle's 310 surface states. The fusing process can be performed at moderate temperatures since nanoparticles melt at much reduced temperatures compared to their bulk counterparts (A. N. Goldstein et al., Science 256, 1425 (1992)). Consequently, it is desirable that the semiconductor nanoparticles 310 have diameters less than 5 nm in order to enhance the sintering process, with a preferred size of 1-3 nm. Typical annealing temperatures are between 250 and 500° C. The annealing can take place in either a tube furnace or a rapid thermal annealer, where a variety of gases (such as, nitrogen, argon, oxygen, hydrogen, or forming gas) can be used depending on the desired outcome. As is well known in the art, other heating apparatus can also be used to anneal the doped semiconductor transport layer. The trapping by surface states is also partially alleviated by the sintering process; however, many surface states remain after typical anneals. The advantage of the invented ex-situ doping process is that the diffusion of the dopant material atoms 340 occurs simultaneously with the fusing of the semiconductor nanoparticles 310 to form a continuous semiconductor layer.

The following example is presented as further understandings of the present invention and is not to be construed as limitations thereon.

EXAMPLE 1

Figure 4:
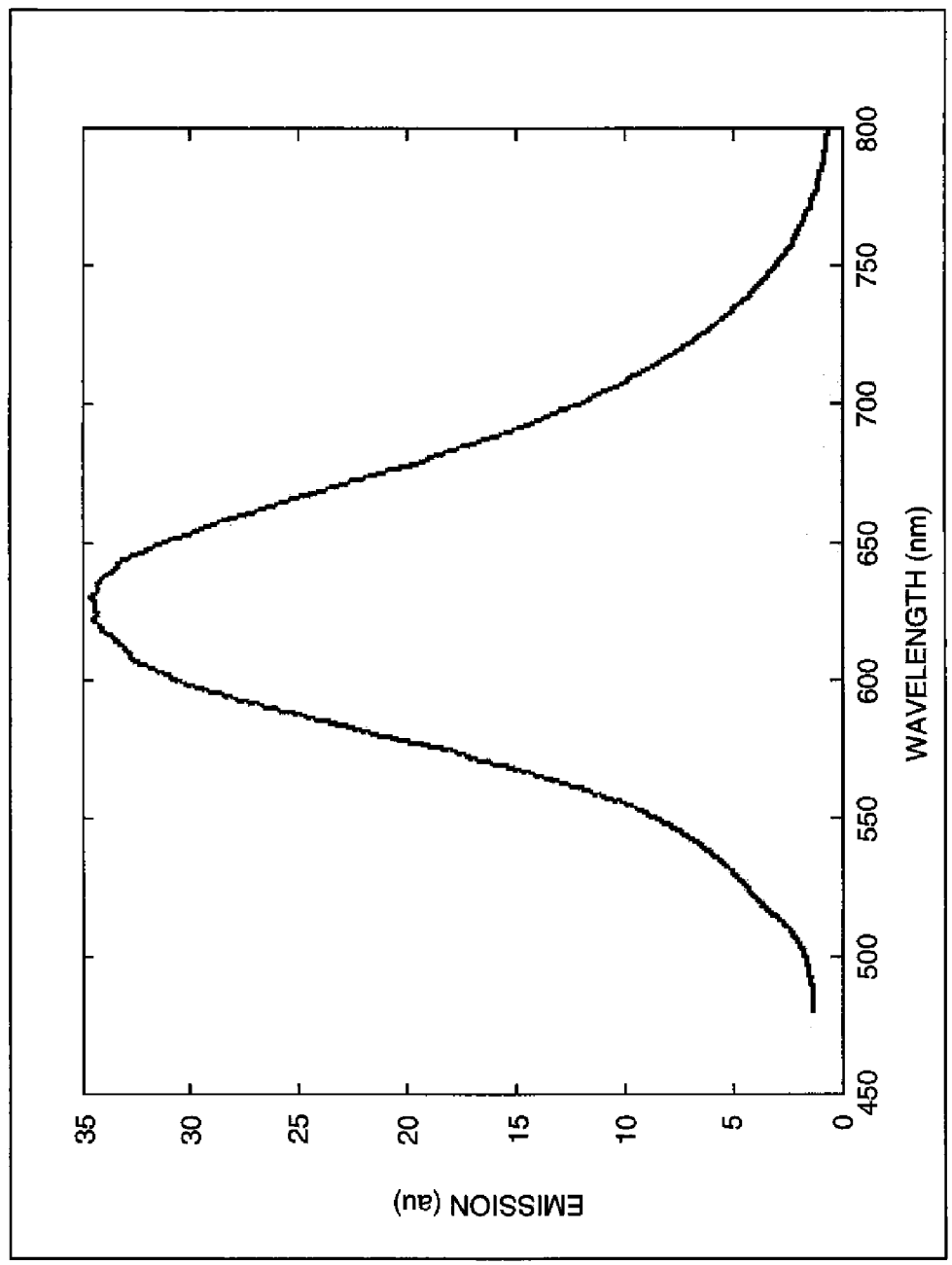
FIG. 4 gives the emission spectrum of an unpurified ZnTe quantum dot crude solution with excitation at 430 nm.

Doped and undoped semiconductor transport layers were formed on glass substrates. The test system was ZnTe, with and without Cu doping (an acceptor for ZnTe which substitutes on the cation site). Undoped ZnTe semiconductor nanoparticles 310 were synthesized by adapting the procedures commonly used to form ZnSe spherical dots (M. A. Hines et al., J. Phys. Chem. B102, 3655 (1998)). More specifically, 4 g of dried and degassed hexadecylamine (HDA) was placed in a three-neck flask and heated, under argon, to 290° C. on a Schlenk line. For the Te precursor, a 0.25 M solution (called TOPTe) of Te in trioctylphosphine (TOP) was formed by heating under vacuum a mixture of Te powder and TOP at 190° C., while vigorously stirring for ~3-4 hours. The resulting solution was clear and has a green-yellow appearance. In a dry box, a syringe was filled with 0.4 mmol of diethylzinc (from a 1 M diethylzinc in hexane solution), 1.6 mmol of TOPTe, and 2.0 ml of additional TOP. The syringe contents were quickly injected into the three-neck flask, while the solution was vigorously stirred. As a result of injecting the room temperature Zn/Te stock solution, the reaction temperature immediately fell ~25° C. It was maintained at 265° C. for 10 minutes in order to form orange-red emitting ZnTe nanocrystals (viewable in room lights). The fluorescence spectrum of the ZnTe crude solution is given in FIG. 4. The UV-VIS absorption spectrum of the ZnTe quantum dot crude solution shows that the dots have a distinct room temperature first exciton absorption peak at ~430 nm.

The literature procedure of Hambrock et al. (J. Hambrock et al., Chem. Commun. 69 (2002)) was followed for forming the copper nanoparticles. In that procedure the copper precursor species is copper alkoxide. To form the copper alkoxide, the synthesis process of Singh et al. (J. V. Singh et al., Z. Anorg. Allg. Chem. 477, 235 (1981)) was modified according to the following procedure. A 500-mL round-bottomed flask was equipped with a magnetic stirring bar and a vigerux column. To the flask was added 50 ml of N,N-dimethylamino-2-propanol, 250 ml of toluene and 2.0 g (0.016 mol) of copper methoxide. The mixture was heated to reflux. For 4 hours at 65-100° C., the solvent was distilled off while under a nitrogen overpressure; the rest of the solvent was distilled off under vacuum. The remaining dark residue was dried under high vacuum and then transferred to a dry box, where it was placed in a sublimation boat. The residue was sublimed to obtain 3.0 g of dark purple crystals (64% yield).

Following Hambrock et al. (J. Hambrock et al., Chem. Commun. 68 (2002)), a 0.3 M solution of copper alkoxide in degassed octylamine was prepared (it was dark brown). 7 g of HDA (dried and degassed) was then placed in a three-neck flask and heated to 300° C. (under nitrogen) on a Schlenk line. While vigorously stirring the HDA at 300° C., 4 ml of the 0.3 M copper precursor solution was rapidly injected into the three-neck flask. Upon injection of the copper precursor solution, the reaction mixture immediately turned a dark red color. After the injection the flask contents cooled to 225° C., where it was left stirring for 30 minutes. The UV-VIS absorption spectrum of the copper crude solution showed the copper nanoparticle plasmon peak to be at ~565 nm, in agreement with the results of Hambrock et al. (J. Hambrock et al., Chem. Commun. 68 (2002)). TEMs indicated that the copper nanoparticles were spherical with particle diameters ranging between 6 and 12 nm.

After having formed the ZnTe and Cu nanoparticles, dispersions were created with alcohols as the solvents. For the ZnTe nanoparticles, ~1-2 ml of crude solution was added to 3 ml of toluene, and 10 ml of methanol in a centrifuge tube. After centrifuging for a few minutes, the supernatant became clear. It was decanted off and 3-4 ml of pyridine was added. The plug quickly dissolved in the pyridine to produce a clear solution. The solution was heated at 80° C. under continuous stirring for 24 hours in order to exchange the TOP and HDA organic ligands 210 for pyridine organic ligands 210. Some of the excess pyridine was then removed by a vacuum prior to adding 13 ml of hexane to the pyridine solution. This solution was then centrifuged, the supernatant decanted, and a mixture of 1-propanol and ethanol was added to the plug in order to get a clear dispersion. For the Cu nanoparticles, an analogous procedure was followed for replacing the amine organic ligands 210 with pyridine organic ligands 210.

In order to form the ex-situ doped semiconductor transport layer 300, mixed dispersions, containing appropriate ratios of ZnTe to Cu nanoparticles, had to be formed. Various ratios of ZnTe to Cu nanoparticles were tried in order to minimize the resistivity of the ex-situ doped semiconductor transport layer 300. The best results were obtained for a mixed dispersion containing a ratio of ZnTe to Cu nanoparticles of ~35:1. The same ZnTe dispersion was used for creating the undoped film as for forming the mixed dispersion.

Prior to measuring the resistivity of the ZnTe films (with and without Cu doping), additional tests were run on the ZnTe and Cu nanoparticles. For the ZnTe nanoparticles the corresponding alcohol-based dispersion was spin coated in air on pre-cleaned borosilicate glass. Using a tube furnace with flowing argon, the nanoparticle-based film was annealed at 160° C. for 30 minutes (to boil off the pyridine ligands), followed by 300° C. for 30 minutes (to sinter the ZnTe nanoparticles). X-ray diffraction analysis of the film revealed it to be cubic ZnTe. Application of the Scherrer formula to the (111) peak revealed that the average crystallite size of the ZnTe was 3.4 nm. For the Cu nanoparticles corresponding films were made in order to verify that highly conductive, metallic films could be formed. Since Cu oxidizes very rapidly in air, the Cu dispersions were drop casted on the pre-cleaned borosilicate glass inside of a dry box. Using a tube furnace with flowing argon, the Cu film was annealed at 160° C. for 30 minutes, followed by 300° C. for 30 minutes. A two-point probe was then employed to measure the resistance of the annealed Cu films. With the probes being 1 cm apart, the measured resistance was 10 ohms. Though not as low as bulk metal films (~2-3 ohms), the resulting film resistance was sufficiently small to verify that the nanoparticles were metallic and that the films did not contain a significant amount of undesirable organic contaminants.

Next resistivity measurements were made on both undoped and Cu doped ZnTe films. The procedure for forming the ZnTe films was as discussed above, except the dispersion was drop coated in a dry box and the resulting film was annealed at 450° C. instead of 300° C. The dispersion was drop casted in a dry box in order to be processed identically to the mixed ZnTe—Cu dispersion. A film composed of the mixed ZnTe—Cu dispersion was also formed and annealed analogously to the undoped ZnTe case. Ohmic contacts (2 mm squares with 2 mm spacings between the square edges) were deposited on the nanoparticle films through a contact mask in order to enable 4-point probe measurements. The ohmic metals (in deposition order) consisted of 150 nm of Pd (sputtered) and 300 nm of Ag (thermally evaporated). Palladium is a well-known ohmic contact for ZnTe, while the Ag was deposited in order to aid in probing the ohmic contacts. Prior to metal evaporation, the films were cleaned with acetone, methanol, and water, and then blown dry with nitrogen. The contacts were annealed in a tube furnace under flowing argon for 5 minutes at 240° C. For all of the annealing and contact formation steps, the doped and undoped samples were processed simultaneously.

Figure 5:
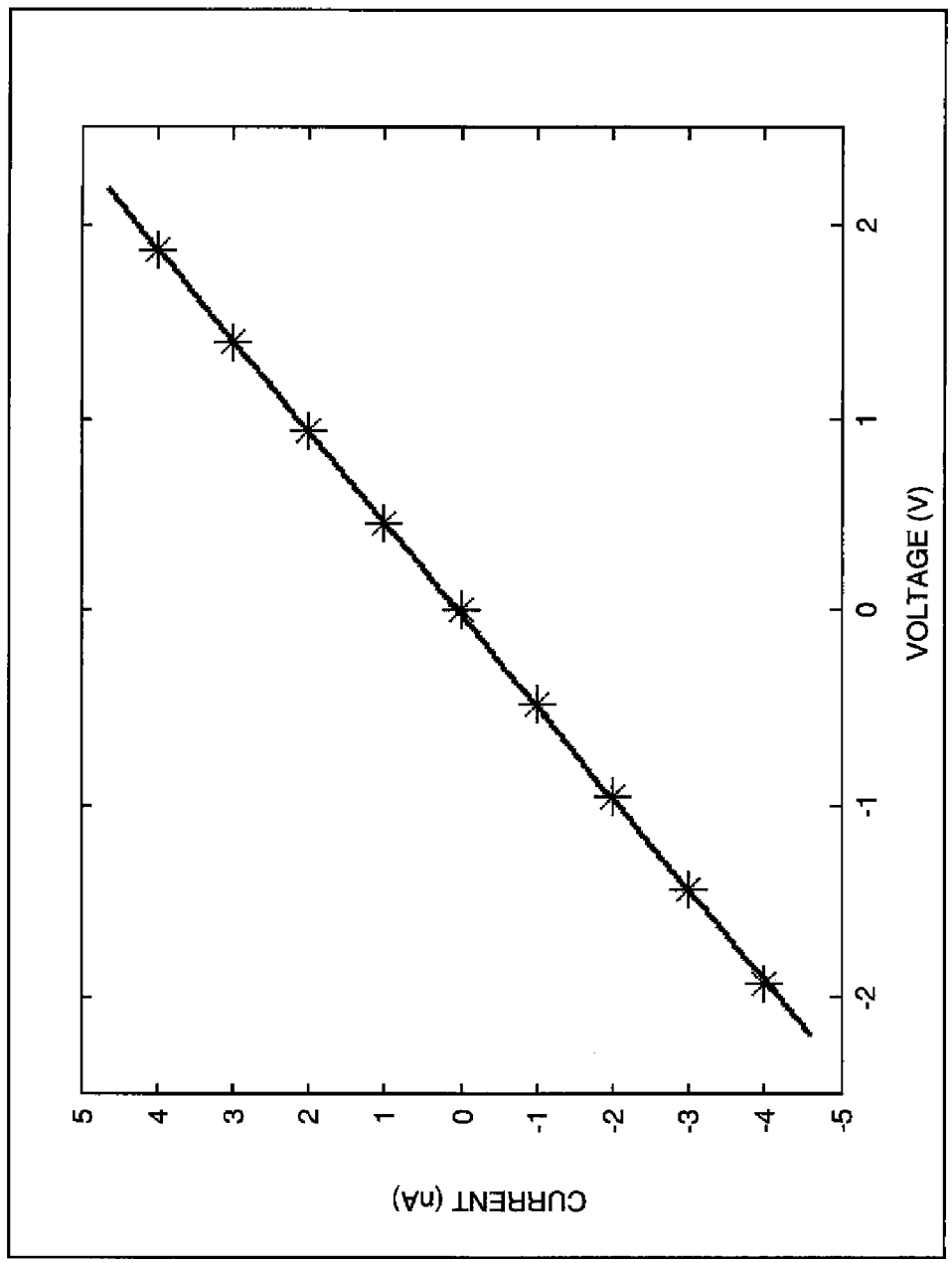
FIG. 5 gives the IV response for a two-point probe measurement of film resistance of Cu-doped ZnTe.

To perform the 4-point probe measurements, a combination of a Keithley 6220 precision current source and a Keithley 6514 electrometer were used. For the doped and undoped samples, the measured sheet resistances were 1.9 GΩ and 15 GΩ, respectively. Since the film thicknesses were 0.2 μm, the corresponding film resistivities were $3.8 \times 10^4$ and $3 \times 10^5$ Ω-cm, respectively. As such, the copper doping resulted in a factor of 8 reduction in film resistivity. The doping experiment was repeated a couple of times to verify that the results were reproducible. It was also verified that the Pd contacts to the ZnTe were ohmic. FIG. 5 shows the IV characteristics of a two-point probe measurement made for the doped sample. Evidence for ohmic contact formation is that the IV trace is linear for both positive and negative currents (the symbols are the data, while the solid line is the linear fit to the data). In addition, the resistance extracted from the IV curve is nearly identical with that obtained from the 4-point probe measurement. Overall, these results show that nanoparticle-based ZnTe films can be doped ex-situ using Cu nanoparticles, which results in a significant reduction in the resistivity of the ex-situ doped semiconductor transport layer 300 in comparison with the undoped transport layer.

The invention has been described in detail with particular reference to certain preferred embodiments thereof, but it will be understood that variations and modifications can be effected within the spirit and scope of the invention.

PARTS LIST 100 substrate
105 light emitting diode device
110 p-contact layer
120 p-transport layer
130 intrinsic emitter layer
140 n-transport layer
150 n-contact layer
160 anode
170 cathode
200 semiconductor core
205 inorganic nanoparticle
210 organic ligand
300 ex-situ doped semiconductor transport layer
310 semiconductor nanoparticles
320 dopant material nanoparticle
330 semiconductor transport layer
340 dopant material atoms

The invention claimed is:

1. A method of making an ex-situ doped semiconductor transport layer for use in an electronic device comprising:
   (a) growing a first set of semiconductor nanoparticles having surface organic ligands in a colloidal solution;
   (b) growing a second set of dopant material nanoparticles having surface organic ligands in a colloidal solution;
   (c) depositing a mixture of the first set of semiconductor nanoparticles and the second set of dopant material nanoparticles on a surface, wherein there are more semiconductor nanoparticles than dopant material nanoparticles;
   (d) performing a first anneal of the deposited mixture of nanoparticles so that the organic ligands boil off the surfaces of the first and second set of nanoparticles; and
   (e) performing a second anneal of the deposited mixture so that the semiconductor nanoparticles fuse to form a continuous semiconductor layer and the dopant material atoms diffuse out from the dopant material nanoparticles and into the continuous semiconductor layer to provide an ex-situ doped semiconductor transport layer.

2. The method of claim 1 wherein the semiconductor is selected from type IV, III-V, II-VI, or IV-VI semiconductor materials.

3. The method of claim 1 wherein the semiconductor is a type II-VI compound and the dopant material is a group Ia, Ib, III, or V element.

4. The method of claim 1 wherein the semiconductor is a type III-V compound and the dopant material is a group IIa, IIb, IV, or VI element.

5. The method claim 1 wherein the semiconductor is a type IV material and the dopant material is a group III or V element.

6. The method claim 1 wherein the semiconductor is a type IV-VI material and the dopant material is a group III or V element.

7. The method of claim 1 wherein the semiconductor nanoparticle is either a quantum dot, rod, wire or any multiply connected nanoparticle that shows quantum confinement effects.

8. The method of claim 1 wherein the dopant material nanoparticle is either a quantum dot, rod, wire or any multiply connected nanoparticle.

9. The method of claim 1 wherein the first anneal is at temperatures below 220° C.

10. The method of claim 1 wherein the second anneal is at temperatures between 250° C. and 500° C.

11. The method of claim 10 wherein the second anneal includes using either a tube furnace or a rapid thermal annealer.

12. A method of making an ex-situ doped semiconductor transport layer for use in an electronic device comprising:
    (a) growing a first set of semiconductor nanoparticles having surface organic ligands in a colloidal solution;
    (b) growing a second set of dopant material nanoparticles having surface organic ligands in a colloidal solution;
    (c) performing ligand exchanges to cover the surfaces of the semiconductor and dopant material nanoparticles with organic ligands whose boiling points are below 200° C.;
    (d) making a dispersion containing the ligand exchanged semiconductor and dopant material nanoparticles and an organic solvent, wherein there are more semiconductor nanoparticles than dopant material nanoparticles;
    (e) coating the dispersion on a surface;
    (f) performing a first anneal of the deposited mixture of nanoparticles so that the organic ligands boil off the surfaces of the semiconductor and dopant material nanoparticles; and
    (g) performing a second anneal of the deposited mixture so that the semiconductor nanoparticles fuse to form a continuous semiconductor layer and the dopant material atoms diffuse out from the dopant material nanoparticles and into the continuous semiconductor layer to provide an ex-situ doped semiconductor transport layer.

13. The method of claim 12 wherein the exchanged ligand is pyridine.

14. The method of claim 12 wherein the solvent is polar.

15. The method of claim 12 wherein the dispersion is coated either by spin coating, drop casting, or inkjetting.

16. The method of claim 12 wherein the first anneal is at temperatures below 220° C.

17. The method of claim 12 wherein the second anneal is at temperatures between 250° C. and 500° C.

* * * * *

UNITED STATES PATENT AND TRADEMARK OFFICE
CERTIFICATE OF CORRECTION

| | | |
|---|---|---|
| PATENT NO. | : 7,375,011 B1 | Page 1 of 1 |
| APPLICATION NO. | : 11/677794 | |
| DATED | : May 20, 2008 | |
| INVENTOR(S) | : Keith B. Kahen | |

It is certified that error appears in the above-identified patent and that said Letters Patent is hereby corrected as shown below:

Page 1, Column 1, OTHER PUBLICATIONS, line 3     Delete "Collodial" and insert --Colloidal--.

Column 12, line 65     Delete "method claim" and insert --method of claim--.

Column 13, line 1     Delete "method claim" and insert --method of claim--.

Signed and Sealed this

Twenty-fifth Day of August, 2009

David J. Kappos
*Director of the United States Patent and Trademark Office*